(12) United States Patent
Morganelli et al.

(10) Patent No.: US 7,047,633 B2
(45) Date of Patent: May 23, 2006

(54) METHOD OF USING PRE-APPLIED UNDERFILL ENCAPSULANT

(75) Inventors: Paul Morganelli, Upton, MA (US); Jayesh Shah, Plaistow, NH (US); David Peard, Windham, NH (US)

(73) Assignee: National Starch and Chemical Investment Holding, Corporation, New Castle, DE (US)

( * ) Notice: Subject to any disclaimer, the term of this patent is extended or adjusted under 35 U.S.C. 154(b) by 335 days.

(21) Appl. No.: 10/444,398

(22) Filed: May 23, 2003

(65) Prior Publication Data
US 2004/0234689 A1    Nov. 25, 2004

(51) Int. Cl.
*H05K 3/30* (2006.01)
(52) U.S. Cl. .................... 29/832; 29/825; 29/840; 174/259; 174/260
(58) Field of Classification Search .................. 29/825, 29/832, 840; 174/259, 260
See application file for complete search history.

(56) References Cited

U.S. PATENT DOCUMENTS

| | | | |
|---|---|---|---|
| 4,604,644 A * | 8/1986 | Beckham et al. | 257/737 |
| 4,917,466 A * | 4/1990 | Nakamura et al. | 349/151 |
| 5,089,440 A * | 2/1992 | Christie et al. | 29/841 |
| 5,232,532 A * | 8/1993 | Hori | 156/163 |
| 5,250,848 A * | 10/1993 | Christie et al. | 257/778 |
| 5,292,688 A * | 3/1994 | Hsiao et al. | 29/840 |
| 5,386,624 A * | 2/1995 | George et al. | 29/832 |
| 5,471,096 A * | 11/1995 | Papathomas et al. | 257/778 |
| 5,536,765 A * | 7/1996 | Papathomas | 524/100 |
| 5,623,006 A * | 4/1997 | Papathomas | 524/100 |
| 5,651,179 A * | 7/1997 | Bessho et al. | 29/832 |

(Continued)

FOREIGN PATENT DOCUMENTS

WO    WO 00/34032    6/2000

(Continued)

*Primary Examiner*—Carl J. Arbes
(74) *Attorney, Agent, or Firm*—Charles W. Almer

(57) ABSTRACT

The invention relates to a method for utilizing one or more B-stageable or pre-formed underfill encapsulant compositions in the application of electronic components, most commonly chip scale packages (CSP's) to substrates. One such composition comprises a thermoplastic resin system comprising a phenoxy resin, an expandable polymer sphere or thermosetting composition, optionally an epoxy resin such as higher molecular weight epoxy resin, a solvent, an imidazole-anhydride catalyst or comparable latent catalyst, and optionally, fluxing agents and/or wetting agents. The underfill encapsulant may be B-stageable to provide a coating on the substrate or component that is smooth and non-tacky. In an alternative embodiment, the underfill encapsulant is a pre-formed film. In both embodiments the expandable filler material expands upon the application of higher temperatures to form a closed-cell foam structure in the desired portion of the assembly. The method of applying the underfill application of the underfill to a component or substrate, attachment of the component and substrate, and heating of the assembly to a temperature sufficient to cause the expandable thermoplastic or thermosetting composition to foam. A second pre-applied underfill composition containing an epoxy resin, an anhydride curing agent, and catalyst may also be applied, either separately or in conjunction with the foamable underfill. The second composition acts as a pressure sensitive adhesive and may be applied selectively to parts of the CSP, for example to the solder bumps. The pressure sensitive adhesive property of the composition provides sufficient tack in order to hold the electronic assembly together during the assembly process.

32 Claims, 1 Drawing Sheet

U.S. PATENT DOCUMENTS

| | | | |
|---|---|---|---|
| 5,656,862 A * | 8/1997 | Papathomas et al. | 257/778 |
| 5,668,059 A * | 9/1997 | Christie et al. | 438/118 |
| 5,880,530 A * | 3/1999 | Mashimoto et al. | 257/783 |
| 6,030,854 A * | 2/2000 | Mashimoto et al. | 438/106 |
| 6,083,774 A * | 7/2000 | Shiobara et al. | 438/108 |
| 6,169,022 B1 | 1/2001 | Saitou | |
| 6,171,887 B1 | 1/2001 | Yamaji | |
| 6,194,788 B1 | 2/2001 | Gilleo et al. | |
| 6,209,196 B1 | 4/2001 | Ozono et al. | |
| 6,225,704 B1 * | 5/2001 | Sumita et al. | 257/789 |
| 6,228,678 B1 | 5/2001 | Gilleo et al. | |
| 6,228,681 B1 | 5/2001 | Gilleo et al. | |
| 6,265,776 B1 | 7/2001 | Gilleo | |
| 6,294,271 B1 * | 9/2001 | Sumita et al. | 428/620 |
| 6,297,560 B1 | 10/2001 | Capote et al. | |
| 6,310,120 B1 * | 10/2001 | Shiobara et al. | 523/458 |
| 6,370,923 B1 * | 4/2002 | Chol | 66/168 |
| 6,399,178 B1 | 6/2002 | Chung | |
| 6,400,033 B1 | 6/2002 | Darveaux | |
| 6,429,238 B1 * | 8/2002 | Sumita et al. | 523/461 |
| 6,479,167 B1 * | 11/2002 | Sumita et al. | 428/620 |
| 6,927,097 B1 | 8/2005 | Dunlap | |
| 2002/0032280 A1 | 3/2002 | Charles et al. | |
| 2002/0043721 A1 | 4/2002 | Weber | |
| 2002/0162679 A1 | 11/2002 | Hannan et al. | |

FOREIGN PATENT DOCUMENTS

| | | |
|---|---|---|
| WO | WO 02/24391 | 3/2002 |
| WO | WO 02/058108 | 7/2002 |
| WO | WO 02/080261 | 10/2002 |
| WO | WO 02/093595 | 11/2002 |

* cited by examiner

METHOD OF USING PRE-APPLIED UNDERFILL ENCAPSULANT

FIELD OF THE INVENTION

The present invention is related to a method for the application of underfill encapsulant to electronic devices.

BACKGROUND OF THE INVENTION

This invention relates to a method of applying underfill encapsulant compounds that contain one or more expandable fillers and/or act as pressure sensitive adhesives. The encapsulants are used to protect and reinforce the interconnections between an electronic component and a substrate in a microelectronic device. Microelectronic devices contain multiple types of electrical circuit components, mainly transistors assembled together in integrated circuit (IC) chips, but also resistors, capacitors, and other components. These electronic components are interconnected to form the circuits, and eventually are connected to and supported on a carrier or a substrate, such as a printed wire board. The integrated circuit component may comprise a single bare chip, a single encapsulated chip, or an encapsulated package of multiple chips. The single bare chip can be attached to a lead frame, which in turn is encapsulated and attached to the printed wire board, or it can be directly attached to the printed wire board. These chips are originally formed as a semiconductor wafer containing multiple chips. The semiconductor wafer is diced as desired into individual chips or chip packages.

Whether the component is a bare chip connected to a lead frame, or a package connected to a printed wire board or other substrate, the connections are made between electrical terminations on the electronic component and corresponding electrical terminations on the substrate. One method for making these connections uses polymeric or metallic material that is applied in bumps to the component or substrate terminals. The terminals are aligned and contacted together and the resulting assembly is heated to reflow the metallic or polymeric material and solidify the connection.

During its normal service life, the electronic assembly is subjected to cycles of elevated and lowered temperatures. Due to the differences in the coefficient of thermal expansion for the electronic component, the interconnect material, and the substrate, this thermal cycling can stress the components of the assembly and cause it to fail. To prevent the failure, the gap between the component and the substrate is filled with a polymeric encapsulant, hereinafter called underfill or underfill encapsulant, to reinforce the interconnect material and to absorb some of the stress of the thermal cycling. Two prominent uses for underfill technology are for reinforcing packages known in the industry as chip scale packages (CSP), in which a chip package is attached to a substrate, and flip-chip packages in which a chip is attached by an array of interconnections to a substrate. Another function of the underfill is to reinforce the component against mechanical shock such as impact or vibration. This is especially important for durability in portable electronic devices such as cellular telephones and the like that may be expected to be accidentally dropped or otherwise stressed during use.

In conventional capillary flow underfill applications, the underfill dispensing and curing takes place after the reflow of the metallic or polymeric interconnect. In this procedure, flux is initially applied on the metal pads on the substrate. Next, the chip is placed on the fluxed area of the substrate, on top of the soldering site. The assembly is then heated to allow for reflow of the solder joint. At this point, a measured amount of underfill encapsulant material is dispensed along one or more peripheral sides of the electronic assembly and capillary action within the component-to-substrate gap draws the material inward. After the gap is filled, additional underfill encapsulant may be dispensed along the complete assembly periphery to help reduce stress concentrations and prolong the fatigue life of the assembled structure. The underfill encapsulant is subsequently cured to reach its optimized final properties. A drawback of capillary underfill is that its application requires several extra steps and is thus not economical for high volume manufacturing.

Recently, attempts have been made to streamline the process and increase efficiency by the use of no-flow underfill and coating the no-flow underfill directly on the assembly site before the placement of the component on that site. After the component is placed it is soldered to the metal connections on the substrate by passing the entire assembly through a reflow oven. During the process the underfill fluxes the solder and metal pads to form the interconnect joints between the interconnect, the substrate and the underfill. One limitation of the no-flow underfill process is that the substrate and components must be pre-dried to avoid excessive voiding within the underfill that will lead to solder extrusion that ultimately may create a short-circuit to another connection. Thus, the substrates must be dried before assembly and then stored in dry storage. This process is unwieldy for high volume manufacturers.

In order to be useful as a pre-applied underfill encapsulant, the underfill must have several important properties. First, the material must be easy to apply uniformly so that the entire assembly has a consistent coating. The underfill encapsulant must be either B-stageable, which means that the underfill must be solidified after its placement on a component to provide a smooth, non-tacky coating with minimal residual solvent, or capable of being formed into a film. Further, there is often great difficulty during manufacturing in uniformly applying conventional underfill materials.

The B-stage process usually occurs at a temperature lower than about 150° C. without prematurely curing the underfill encapsulant. The final curing of the underfill encapsulant must be delayed until after the solder fluxing (in the situation that solder is the interconnect material) and interconnection, which occurs at a temperature of 183° C. in the case of tin/lead eutectic solder. The final curing of the underfill should occur rapidly after the solder bump flow and interconnection. During this final attachment of the individual chips to a substrate, the underfill encapsulant must flow in order to enable fillet formation and provide good adhesion between the chip, or chip passivation layer, the substrate, or the solder mask, and the solder joints.

SUMMARY OF THE INVENTION

The invention relates to a method for utilizing one or more B-stageable or pre-formed underfill encapsulant compositions in the application of electronic components, most commonly chip scale packages (CSP's), to substrates. One such composition comprises a thermoplastic resin system comprising a phenoxy resin, an expandable polymer sphere or thermosetting composition, optionally an epoxy resin such as higher molecular weight epoxy resin, a solvent, optionally an imidazole-anhydride catalyst or comparable latent catalyst, and optionally, fluxing agents and/or wetting agents. Various other additives, such as adhesion promoters, flow additives and rheology modifiers may also be added as desired. The underfill encapsulant may be B-stageable to provide a coating on the substrate or component that is smooth and non-tacky. In an alternative embodiment, the underfill encapsulant is a pre-formed film. In both embodiments the expandable filler material expands upon the application of higher temperatures to form a closed-cell foam structure in the desired portion of the assembly. The method comprises applying the underfill to a component or substrate, attachment of the component and substrate, and heating of the assembly to a temperature sufficient to cause the expandable thermoplastic or thermosetting composition to foam. The underfill may also be applied selectively to parts of the CSP, for example to the perimeter, as discrete dots between the solder bumps or in a grid pattern between the rows of solder bumps. A second pre-applied underfill composition containing an epoxy resin, an anhydride curing agent, and catalyst may also be applied, either separately or in conjunction with the foamable underfill. The second composition acts as a pressure sensitive adhesive and may be applied selectively to parts of the CSP, for example to the solder bumps. The pressure sensitive adhesive property of the composition provides sufficient tack in order to hold the electronic assembly together during the assembly process. Like no-flow underfill, the pressure sensitive composition of the present invention also fluxes the solder to facilitate connection to the metal pads, thus eliminating the need for a separate processing aid such as solder paste or flux.

DETAILED DESCRIPTION OF THE INVENTION

Figure 1:
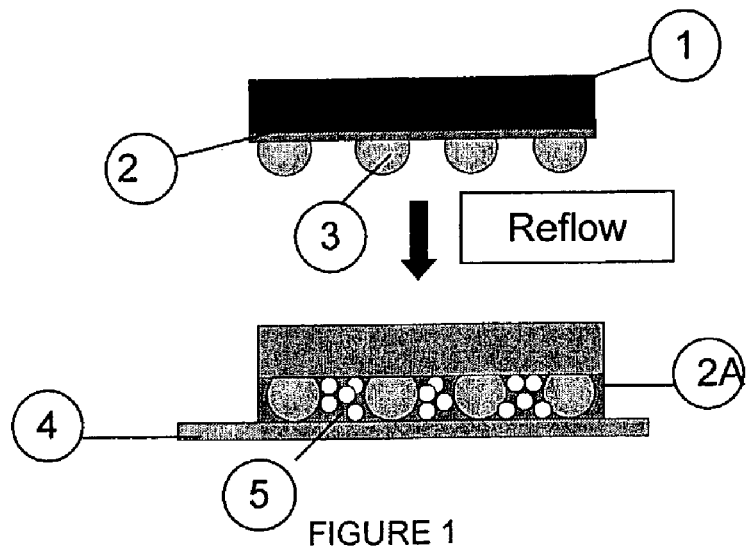
FIG. 1 is a diagram of an assembly having foamable underfill before and after reflow.

The resins used in the underfill encapsulant composition of the present invention may be curable compounds, which means that they are capable of polymerization. As used in this specification, to cure will mean to polymerize, with cross-linking. Cross-linking, as understood in the art, is the attachment of two-polymer chains by bridges of an element, a molecular group, or a compound, and in general takes place upon heating.

Thermoplastic or thermoset resin systems containing expandable fillers may be formulated and pre-applied on electronic components such as area array devices, including CSPs and BGA's, either as a B-stageable liquid material or as a laminated film. In both situations, the expandable fillers remain unexpanded after the initial application of the encapsulant to the component. The component containing the encapsulant is then placed on a substrate using solder paste and/or flux and passed through a reflow oven wherein the components electrically connect to the substrate. During the reflow process the unexpanded polymer spheres expand and fill the desired area, frequently the area between the solder joints, with a closed-cell foam structure.

Ingredients of the underfill encapsulant composition of the present invention include a blend of one or more phenoxy resins, a thermoplastic or thermosetting polymer capable of expanding at elevated temperatures, and one or more solvents. Optionally, fluxing agents, air release agents, flow additives, adhesion promoters, rheology modifiers, surfactants and other ingredients may be included. The ingredients are specifically chosen to obtain the desired balance of properties for the use of the particular resins. A solvent is chosen to dissolve the resin(s) and thus make the composition into a liquid with proper viscosity for application via spin coating, screen printing or stencil printing on the CSP panel. The underfill system may also be applied as a solid, pre-formed laminated film.

In a preferred embodiment, the composition contains a solvent, and is B-stageable, i.e., the composition is capable of an initial solidification that produces a, smooth, non-tacky coating on the electronic component to be attached to a substrate. The B-stage solidification preferably occurs in at a temperature in the range of about 60° C. to about 150° C. At this temperature the expandable fillers do not expand. After the B-stage process, a smooth, non-tacky solid coating is obtained on the CSP panel to ensure the clean dicing of the CSP panel into individual CSPs. The final, complete curing occurs during exposure to the solder reflow temperature profile. The expandable fillers will expand within the same solder reflow conditions necessary to produce the final curing. Generally, the final cure of the composition occurs after the formation of the interconnections. In the case of Pb/Sn eutectic solder, the formation of the interconnections occurs at a temperature above the melting point of the solder, which is 183° C. In an alternative preferred embodiment, the composition is a pre-formed laminated film. The film is a phenoxy resin, but thermoplastic polyesters, polyamides, polyurethanes, polyolefins or the like, compounded with expandable spheres, may be expected to work. Examples of phenoxy resins suitable for use in the present underfill composition include high molecular weight solids. Examples are resins available from Inchem under the tradenames PKHC, PKHH, HC and HH, or blends of these with liquid epoxy resins.

The expandable fillers utilized in the underfill must be sufficient to produce a closed-cell foam that will fill the desired area. Frequently, the desired area is either the entire surface area surrounding the solder joints or a line around the perimeter of the assembly. A preferred expandable filler material is expandable thermoplastic micro balloons, such as are commercially available from Akzo Nobel (Sweden) as 098 DUX 120, 091DU, 092 DU, and 095 DU. These microspheres are filled with iso-octane and are stable at lower temperatures. The micro balloons do not expand at temperatures below 160C, the temperature at which B-staging of the underfill occurs. The microspheres expand at temperatures above 160C and reach their maximum expansion at approximately 220C which is typically the highest peak temperature for curing in eutectic soldering processes. Upon expansion the microspheres create a closed-cell structure within the underfill matrix. Other materials that may be utilized to provide the foam structure include chemical blowing agents.

A solvent is utilized to modify the viscosity of the composition. Preferably, the solvent will evaporate during the B-stage process, which occurs at temperatures lower than about 150° C., or during the formation of the film. Common solvents that readily dissolve the epoxy and phenoxy resins can be used. Examples of solvents that may be utilized include esters, alcohols, ethers, and other common solvents that are stable and dissolve the epoxy and phenoxy resins in the composition. The preferred solvent is propylene glycol methyl ethyl acetate (PGMEA). Solvents that dissolve any part of the expandable microspheres should be avoided.

A preferred embodiment of the underfill encapsulant of the present invention comprises at least one phenoxy resin, at least one expandable filler, solvent, and other ingredients as desired. The resin component of the underfill will comprise in the range of about 10 to about 50 wt % of the B-stageable composition and preferably about 20 to about 40 wt %. The expandable filler component of the underfill comprises in the range of about 0.02 to about 10 wt % of the B-stageable composition and preferably about 0.1 to about 5 wt %. Finally, optional ingredients such as surfactants, air release agents, flow additives, rheology modifiers, chemical blowing agents and adhesion promoters may be added to the composition in the range of about 0.01 wt % to about 5 wt % of the composition.

To utilize the underfill composition containing the expandable fillers as a B-stageable liquid, the underfill is first applied directly onto an individual component or panel of components via screen-printing, spin coating, stencil printing or dispensing through a needle between rows of solder bumps. The chip having the coating is heated to an initial, B-stage temperature and the composition is solidified. Preferably, this heating results in a coating that is smooth and non-tacky and does not cause the expansion of the microspheres. The thickness of the coating is approximately 10–30% of the diameter of the solder bumps. Following the B-stage heating, the solder bump tips may be plasma etched, or cleanded with solvent, to facilitate component recognition in a placement machine. The components having the B-staged composition are placed on a substrate with the solder bumps located on the metal pad connections. The use of solder paste or standard flux is required to maintain correct alignment of the component, as well as to facilitate the fluxing and solder joint formation. The entire assembly is heated to a temperature of approximately 183° C. (in the case that lead/tin solder is utilized). This second heating causes the formation of interconnections between the substrate and the chip and causes the microspheres to expand and to fill the gap between the component and substrate.

To utilize the underfill encapsulant of the present invention as a laminated film, the film would be pre-cast on a carrier film and then dried at a temperature below the expansion initiation temperature of the expandable filler. After removal of the carrier film, the underfill would be vacuum laminated on to a portion of or the full area of the component at the softening temperature of the system. Finally, the solder bump tips would be cleaned via plasma etching or with solvent, and the component would be ready for placement. Alternatively, the film can be pre-cut into different configurations such as a grid, mesh, thin strip, or square box pattern and placed or laminated onto the component. In this way contact between the solder bump and the underfill can be avoided and hence eliminate the need for plasma etching or wiping with solvent. After placement, the component is subjected to reflow which causes the expansion of the expandable fillers into the closed-cell structures. Both the B-stageable and laminated film applications require stencil printing of the solder paste before the component is placed.

Either separately or in conjunction with the underfill having expandable fillers, a fluxing underfill composition that acts as a pressure sensitive adhesive upon application may also be pre-applied to the electronic components. The composition contains an epoxy resin, an anhydride curing agent, and catalyst. Other materials, such as air release agents and fillers, may also be added as desired. The ingredients are specifically chosen to obtain the desired balance of properties for the use of the particular resins. The composition may be applied selectively to parts of the component, for example to the solder bumps. The pressure sensitive adhesive property of the composition provides sufficient tack in order to hold the electronic assembly together during the assembly process. Like no-flow, the composition of the present invention also fluxes the solder to metal pad connections, thus eliminating the need for a separate processing aid such as solder paste or flux. The pre-applied fluxable underfill composition initially provides the properties of a pressure sensitive adhesive at room temperature and may be used either with or without an expandable or other underfill composition. The underfill composition cures and is non-tacky after the application of a sufficient amount of heat. The underfill may be applied either to the tips of the connectors, such as solder bumps, located between the substrate and the CSP, as a film, or along all or a portion of the sides of the solder bumps. The epoxy-anhydride composition is stable under ambient storage conditions.

Examples of epoxy resins suitable for use in the present underfill composition include monofunctional and multifunctional glycidyl ethers of Bisphenol-A and Bisphenol-F, and cycloaliphatic epoxy resins or a combination thereof. The cycloaliphatic epoxides are preferably selected from non-glycidyl ether epoxides containing more than one 1.2 epoxy group per molecule.

Glycidyl ether epoxides are preferred in the invention, either separately or in combination with the non-glycidyl ether epoxides. A preferred epoxy resin of this type is bisphenol A or bisphenol F epoxy resin. These resins are generally prepared by the reaction of one mole of bisphenol F or bisphenol A resin and two moles of epichlorohydrin. A further preferred type of epoxy resin is epoxy novolac resin. Epoxy novolac resin is commonly prepared by the reaction of phenolic resin and epichlorohydrin. A preferred epoxy novolac resin is poly(phenyl glycidyl ether)-co-formaldehyde. Biphenyl type epoxy resin may also be utilized in the present invention. This type of resin is commonly prepared by the reaction of biphenyl resin and epichlorohydrin. Dicyclopentadiene-phenol epoxy resin, naphthalene resins, epoxy functional butadiene acrylonitrile copolymers, epoxy functional polydimethyl siloxane and mixtures thereof are additional types of epoxy resins which may be employed. Commercially available bisphenol-F type resin is available from CVC Specialty Chemicals, Maple Shade, N.J., under the designation 8230E and Resolution Performance Products LLC under the designation RSL1739. Bisphenol-A type epoxy resin is commercially available from Resolution Technology as EPON 828, and a blend of bisphenol-A and bisphenol-F is available from Nippon Chemical Company under the designation ZX-1059.

Examples of anhydride curing agents suitable for use in the invention are cycloaliphatic anhydrides, aromatic anhydrides, polyanhydrides, and mixtures thereof. The most preferred anhydride is polysebacic polyanhydride, available from Lonza Chemical. Other preferred anhydride curing agents are polyazelaic polyanhydride and polyadipic polyanhydride. Other anhydrides that may be utilized include methyhexahydrophthalic anhydride, hexahydro phthalic anhydride, tetrahydro phthalic anhydride, phthalic anhydride, bisphenyl dianhydride, benzophenone tetracarboxylic dianhydride, and mixtures thereof In addition to the resins and anhydride curing agent, an imidazole, imidazole salt, or other suitable catalyst is included in the pre-applied underfill composition as a catalyst.

Additional ingredients may be added to the composition to produce a composition with the desired properties. For example, monofunctional reactive diluents can incrementally delay the increase in viscosity without adversely affecting the physical properties of the cured underfill. Preferred diluents include p-tert-butyl-phenyl glycidyl ether, allyl glycidyl ether, glycerol diglycidyl ether, glycidyl ether of alkyl phenol (commercially available from Cardolite Corporation as Cardolite NC513), and Butanedioldiglycidylether (commercially available as BDGE from Aldrich), although other diluents may be utilized. Surfactants may be utilized to aid in the prevention of process voiding during the component bonding process and subsequent solder joint reflow and material curing. Various surfactants which may be utilized include organic acrylic polymers, silicones, polyoxyethylene/polyoxypropylene block copolymers, ethylene diamine based polyoxyethylene/polyoxypropylene block copolymers, polyol-based polyoxyalkylenes, fatty alcohol-based polyoxyalkylenes, fatty alcohol polyoxyalkylene alkyl ethers and mixtures thereof. In addition, coupling agents, air release agents, flow additives, adhesion promoters and other ingredients may also be added as desired.

A preferred embodiment of the composition of the present invention comprises at least one epoxy resin, an anhydride curing agent, an imidazole-based catalyst, and other ingredients as desired. The composition will comprise in the range of about 30 wt % to about 98 wt % of epoxy resin and preferably in the range of about 50 wt % to about 90 wt %. The composition will also comprise in the range of about 2 wt % to about 70 wt % of an anhydride curing agent and preferably in the range of about 30 wt % to about 50 wt percent of the composition. An imidazole, or imidazole salt is added as a catalyst. The catalyst comprises in the range about 0.01 wt % to about 10 wt % of the underfill composition and preferably about 0.1 wt % to about 5 wt % of the composition. Finally, optional ingredients such as surfactants, air release agents, flow additives, rheology modifiers, and adhesion promoters may be added to the composition in the range of about 0.01 wt % to about 5 wt % of the composition.

The pressure sensitive pre-applied underfill composition preferably has a slightly tacky consistency at room temperature. This consistency provides initial adhesion during use with a CSP. In use, the pre-applied underfill is coated on a release liner at a desired thickness, preferably about 10 to about 70% of the solder bump height of the CSP. The coating is held at a slightly higher temperature than its melt temperature. The CSP solder bump array is dipped into the coating and then pressed onto a non-stick surface, such as a release liner, at room temperature in order to flatten the surface of the underfill. A coating of the pre-applied underfill is formed on the tips of the CSP during this dipping process. As the material on the tips of the CSP cools down to room temperature, it solidifies to a slightly tacky consistency. At this time the CSP is removed from the release liner and is in condition for placement on the desired substrate site without the application of any additional flux or solder paste. In an alternative embodiment, the underfill material may be dispensed in a pre-measured quantity through a heated syringe. In this embodiment, the CSP is preferably pre-heated so as to allow the underfill to self-level itself on the CSP. The pre-applied underfill is very stable at room temperature and, in the absence of a solvent, does not shrink after pre-application. The pre-applied fluxing underfill provides sufficient tack to hold the CSP in place on the substrate on its own. Upon exposure to heat during a standard eutectic reflow process, the pre-applied fluxing underfill melts to a low viscosity and provides the desired fluxing to the solder and metal pads to facilitate solder wetting and subsequent solder joint connection. Upon cooling, the pre-applied fluxing underfill cures to a low modulus thermosetting compound that provides reinforcement to the solder joint for protection against mechanical and thermal shock.

Alternatively, the pre-applied fluxable underfill may be applied as a film at the bottom of the CSP, at an intermediate thickness relative to the height of the solder bump. To apply the composition in this manner, the underfill is applied to a release liner at a temperature in the range of about 60–85C and a thickness in the range of about 10 to about 70% of the solder bump height. As the material cools, the CSP is placed on the coating with light pressure to ensure that the solder bumps penetrate into the composition. The liner is then removed and the material is transferred over to the CSP. Via this process, more underfill material is added to the CSP than is added via the dipping process. The additional material may result in higher reinforcement and better performance. Another advantage of applying the underfill to a partial fraction of the height of the solder bump is that this provides space for volatile compounds to escape from beneath the CSP during the reflow process.

The pre-applied underfill composition may also be utilized in a non-pressure sensitive format. In the case where the composition is not pressure sensitive, the substrate or CSP must be heated to create the tack necessary to attach the CSP to the substrate.

Figure 2:
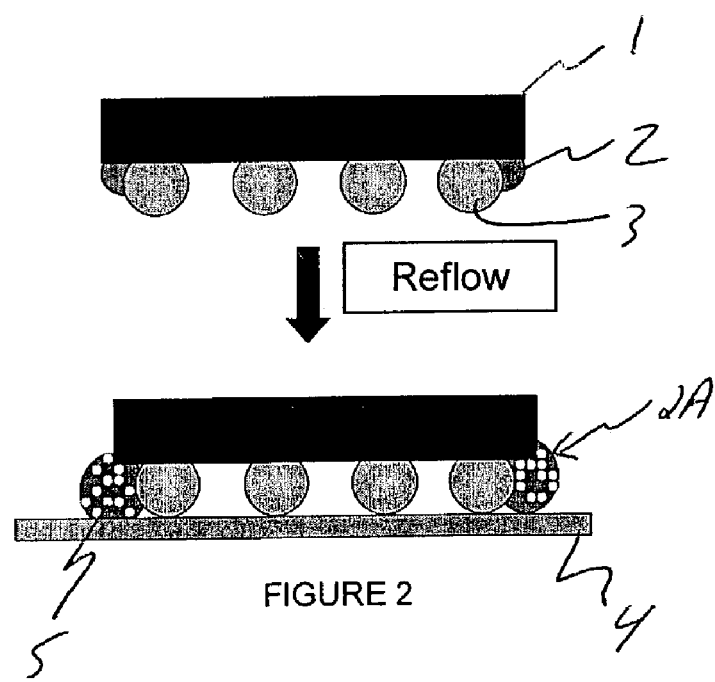
FIG. 2 is a diagram of an assembly having foamable underfill around its perimeter before and after reflow.

FIG. 1 illustrates the expansion of the expandable fillers after reflow. Electrical component 1 is initially provided with a B-staged or film layer of underfill 2 and solder bumps 3. After reflow, the assembly of the electrical component and the substrate 4 has expanded underfill 2A that contains closed cell structures 5. In FIG. 1 the underfill fills substantially all of the area in and around the solder bumps between the component and the substrate. FIG. 2 illustrates an alternative underfill application in which the underfill 2 is applied to the perimeter of the component 1. The expanded underfill 2A is shown with the closed cell structures around the perimeter of the component after reflow.

The invention may be better understood by reference to the following examples:

EXAMPLE 1

Thermoplastic and thermosetting underfill compositions were manufactured as follows (all amounts of ingredients are indicated by weight percent). A mixture of solvent and resin is added to a mixing vessel equipped with a propeller stirrer. The expandable filler is then added and mixed for 5–10 minutes until homogeneous. A surfactant is then added to facilitate vacuum removal of air bubbles. The mixture is de-gassed for 5 minutes in a vacuum chamber at a pressure of >28 in Hg. The formulations of the resulting thermoplastic underfills are shown in Table 1.

TABLE 1

Thermoplastic Underfill with Expandable Filler

| Material | Formulation A | Formulation B |
|---|---|---|
| PKHS-30PMA[1] | 19.8 | 20.0 |
| Byk-A-500[2] | 0.05 | 0.05 |
| 098 DUX 120 | 0.2 | 0.1 |

[1] Phenoxy Resin solution in PGMEA, available from Inchem
[2] Air-release additive, available from BYK Chemie Formulation A was tested for various properties, including drop impact, and the results of those tests are set out in Table 2.

TABLE 2

Performance of Underfill with Expandable Filler

| Performance Properties | Value |
| --- | --- |
| Storage Modulus by DMA @ 25 C. | 97.5 Mpa |
| Peak tan - delta C | 100 |
| Storage Modulus by DMA* @ 25 C. | 112 Mpa |
| Moisture Absorption* | <0.1% |
| Drop Performance** | 50 Drops |
| Drop Performance (No Underfill) | 5 Drops |

*7 days exposure at 30 C./60% relative humidity
**2 meter height (60 mil FR-4 board, pBGA-169 component I/O 169, solder dia = 24 mil)

As shown in Table 2, the performance of the component is dramatically improved over the performance of the component having no underfill.

EXAMPLE 2

A formulation of the pressure sensitive pre-applied fluxing underfill was made having the ingredients listed in Table 3.

TABLE 3

Pressure sensitive pre-applied fluxing underfill

| Ingredient | Wt % |
| --- | --- |
| CVC8230E* | 54.02 |
| Polysebacic polyanhydride | 45.73 |
| 2-phenylimidazole phosphate | 0.25 |

*Bisphenol-A/Bisphenol-F Epoxy Resin blend

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

We claim:

1. A method of preparing one or more surface mount components, comprising the steps of
   a) applying underfill encapsulant containing at least one expandable filler material to a silicon chip package;
   b) B-stage processing the encapsulant on the silicon chip package so that the encapsulant solidifies into a smooth, non-tacky coating;
   c) affixing the silicon chip package to a substrate to form an assembly; and
   subjecting the assembly to heat such that the expandable filler expands to form a closed-cell structure within the underfill,
wherein the at least one expandable filler is selected from the group comprising microspheres, expandable balloons, and mixtures thereof.

2. The method of claim 1, wherein the encapsulant is applied to the package panel via spin coating, screen-printing or stencil printing.

3. The method of claim 1, wherein the one or more expandable fillers comprises in the range of about 0.1 wt % to about 10 wt % of the encapsulant.

4. The method of claim 1, wherein the one or more expandable fillers expand upon exposure to temperatures greater than about 150 C.

5. The method of claim 1, wherein the encapsulant is provided in the form of a film.

6. A method of preparing one or more surface mount component containing one or more solder bumps having an exposed tip and at least one side, comprising the steps of:
   a) applying an underfill encapsulant containing at least one expandable filler material to the component;
   b) affixing the component to a substrate to form an assembly; and
   c) subjecting the assembly to heat such that the expandable filler expands to form a closed-cell structure within the encapsulant,
wherein the at least one expandable filler is selected from the group comprising microspheres, expandable balloons, and mixtures thereof.

7. The method of claim 6, further comprising the step of placing a pressure sensitive fluxable underfill encapsulant on the tip of one or more of the solder bumps.

8. The method of claim 6, wherein the pressure sensitive fluxable underfill encapsulant is applied to at least a portion of at least one side of the solder bumps.

9. The method of claim 6, wherein the encapsulant is applied at a thickness in the range of about 10 to about 70% of the height of the solder bumps.

10. A method of preparing one or more surface mount components containing one or more solder bumps having an exposed tip and at least one side, comprising the steps of:
    a) providing an underfill encapsulant at a temperature higher than the melt temperature of the underfill encapsulant;
    b) contacting the component with the underfill encapsulant such that a coating of underfill encapsulant is formed on at least one of the solder bumps; and
    c) cooling the underfill encapsulant to a temperature such that the coating solidifies to a tacky consistency; and
    d) contacting the component with the coating with a non-stick surface.

11. The method of claim 10, further comprising the step of placing a pressure sensitive fluxable underfill encapsulant on the tip of one or more of the solder bumps.

12. The method of claim 10, wherein the pressure sensitive underfill encapsulant is applied to at least a portion of at least one side of the solder bumps.

13. The method of claim 10, wherein the encapsulant is applied at a thickness in the range of about 10 to about 70% of the height of the solder bumps.

14. The method of claim 10, further comprising the step of heating the component such that the coating becomes tacky.

15. The method of claim 10, further comprising the step of contacting the surface mount component with a substrate.

16. The method of claim 10, wherein the encapsulant is provided on a release liner.

17. The method of claim 16, further comprising the step of removing the component from the release liner.

18. The method of claim 10, wherein the encapsulant is provided via a syringe.

19. The method of claim 10, wherein the underfill encapsulant comprises one or more epoxy resins, an anhydride curing agent and at least one catalyst.

20. The method of claim 10, wherein the underfill encapsulant fluxes a connection between the component and the substrate.

21. A method of preparing one or more surface mount components containing one or more solder bumps having an exposed tip and at least one side, comprising the steps of:

a) applying a first underfill encapsulant to the component;
b) providing a second underfill encapsulant at a temperature higher than the melt temperature of the second underfill encapsulant;
c) contacting the CSP or BGA with the second underfill encapsulant such that a coating of underfill encapsulant is formed on the solder bumps;
d) cooling the second underfill encapsulant to a temperature such that the coating solidifies to a tacky consistency.

22. The method of claim 21, wherein the second underfill encapsulant is applied to the tip of one or more of the solder bumps.

23. The method of claim 21, wherein the second underfill encapsulant is applied to at least a portion of at least one side of the solder bumps.

24. The method of claim 21, wherein the first underfill encapsulant is applied at a thickness in the range of about 10 to about 70% of the height of the solder bumps.

25. The method of claim 21, wherein the first underfill encapsulant contains at least one expandable filler material.

26. The method of claim 25, further comprising the step of subjecting the assembly to heat such that the expandable filler expands to form a closed-cell structure within the first underfill encapsulant.

27. The method of claim 21, wherein the second encapsulant is provided on a release liner.

28. The method of claim 26, further comprising the step of removing the component from the release liner.

29. The method of claim 21, wherein the encapsulant is provided via a syringe.

30. The method of claim 21 further comprising the step of heating the component such that the coating becomes non-tacky.

31. The method of claim 21, further comprising the step of contacting the component with a substrate.

32. The method of claim 21, wherein the first underfill encapsulant is B-stage processed on the surface mount component.

* * * * *